(12) United States Patent
Peh et al.

(10) Patent No.: US 11,742,843 B2
(45) Date of Patent: *Aug. 29, 2023

(54) APPARATUS FOR OFFSET CANCELLATION IN COMPARATORS AND ASSOCIATED METHODS

(71) Applicant: Silicon Laboratories Inc., Austin, TX (US)

(72) Inventors: Sheng Jue Peh, Singapore (SG); Obaida Mohammed Khaled Abu Hilal, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/857,171

(22) Filed: Apr. 23, 2020

(65) Prior Publication Data
US 2021/0336614 A1 Oct. 28, 2021

(51) Int. Cl.
| | |
|---|---|
| *H03K 3/013* | (2006.01) |
| *H03K 3/0233* | (2006.01) |
| *H03K 5/22* | (2006.01) |
| *H03M 1/06* | (2006.01) |
| *H03K 5/24* | (2006.01) |
| *G01K 7/00* | (2006.01) |
| *H03M 1/38* | (2006.01) |

(52) U.S. Cl.
CPC ............... *H03K 5/24* (2013.01); *G01K 7/00* (2013.01); *H03M 1/38* (2013.01)

(58) Field of Classification Search
None
See application file for complete search history.

(56) References Cited

U.S. PATENT DOCUMENTS

| | | | | | |
|---|---|---|---|---|---|
| 4,547,683 | A | * | 10/1985 | Bingham | H03K 5/249 327/3 |
| 4,612,531 | A | * | 9/1986 | Dingwall | H03M 1/148 341/156 |
| 4,965,468 | A | * | 10/1990 | Nicollini | H03F 3/45192 327/208 |
| 4,989,003 | A | * | 1/1991 | Sauer | H03K 5/249 341/136 |
| 5,065,045 | A | * | 11/1991 | Mok | H03K 5/249 327/63 |
| 5,546,028 | A | * | 8/1996 | Yamaguchi | H03K 5/2481 327/64 |
| 6,150,850 | A | * | 11/2000 | Kinoshita | H03K 5/249 327/337 |
| 6,429,697 | B1 | * | 8/2002 | Amazeen | H03F 3/45183 327/362 |

(Continued)

OTHER PUBLICATIONS

Wu et al., "Precision Instrumentation Amplifiers and Read-Out Integrated Circuits Analog Circuits and Signal Processing," pp. 21-49 (2012).

(Continued)

*Primary Examiner* — Kenneth B Wells
(74) *Attorney, Agent, or Firm* — Law Offices of Maximilian R. Peterson

(57) ABSTRACT

An apparatus includes a comparator. The comparator includes a plurality of pregain stages, and a switch network coupled to the plurality of pregain stages. The comparator further includes a latch coupled to the plurality of pregain stages.

20 Claims, 11 Drawing Sheets

(56) References Cited

U.S. PATENT DOCUMENTS

| | | | | |
|---|---|---|---|---|
| 7,551,116 B2* | 6/2009 | Tomisawa | ......... | H03K 3/35613 |
| | | | | 341/155 |
| 7,977,979 B2* | 7/2011 | Cho | ................... | H03F 3/45475 |
| | | | | 327/63 |
| 8,248,108 B2* | 8/2012 | Santoro | ................. | H03K 5/249 |
| | | | | 327/63 |
| 8,368,577 B2* | 2/2013 | Aruga | .................... | H01L 29/94 |
| | | | | 341/172 |
| 8,508,398 B1* | 8/2013 | Strode | ............... | H03M 1/0607 |
| | | | | 341/161 |
| 9,019,139 B2* | 4/2015 | Mansoorian | ......... | H03M 1/464 |
| | | | | 341/156 |
| 2004/0246030 A1* | 12/2004 | Yang | ................ | H03K 3/35613 |
| | | | | 327/58 |
| 2009/0134914 A1* | 5/2009 | Huang | ................... | H03K 5/24 |
| | | | | 327/64 |

OTHER PUBLICATIONS

U.S. Appl. No. 17/364,542, filed Jun. 2021, Peh.
Office communication in U.S. Appl. No. 17/365,542, 12 pgs.

\* cited by examiner

APPARATUS FOR OFFSET CANCELLATION IN COMPARATORS AND ASSOCIATED METHODS

TECHNICAL FIELD

The disclosure relates generally to electronic circuits such as comparators and, more particularly, to apparatus for comparators with offset cancellation, and associated methods.

BACKGROUND

With advances in technology, an increasing number of circuit elements have been integrated into devices, such as integrated circuits (ICs). Furthermore, a growing number of devices, such as ICs, or subsystems, have been integrated into products. With developments such as the Internet of Things (IoT), this trend is expected to continue.

The circuit elements sometimes include comparators. Comparators typically are used in a variety of applications, including applications with relatively high precision or accuracy. In some circumstances, the offset present in comparators can affect the performance of the comparator in such applications. Several conventional approaches have been used for offset correction in comparators, as FIGS. 1 and 2 illustrate. The details of operations of the circuits in those figures are known to persons of ordinary skill in the art and are not described here further.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments. According to one exemplary embodiment, an apparatus includes a comparator. The comparator includes a plurality of pregain stages, and a switch network coupled to the plurality of pregain stages. The comparator further includes a latch coupled to the plurality of pregain stages.

According to another exemplary embodiment, an apparatus includes a comparator. The comparator includes a plurality of pregain stages coupled in cascade. The comparator further includes a switch network that includes a set of switches coupled to the plurality of pregain stages. The set of switches are responsive to a set of clock signals to cancel an offset of the comparator. The comparator further includes a latch coupled to a last pregain stage in the plurality of pregain stages.

According to another exemplary embodiment, a method of operating a comparator to cancel an offset of the comparator. The method includes operating a switch network to: (a) selectively couple a pregain stage in a plurality of pregain stages to a voltage, and (b) selectively provide a feedback path around a pair of pregain stages in the plurality of pregain stages.

BRIEF DESCRIPTION OF THE DRAWINGS

The appended drawings illustrate only exemplary embodiments and therefore should not be considered as limiting the scope of the application or of the claimed subject-matter. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to comparators with improved functionality or characteristics. More specifically, the disclosed concepts provide apparatus and methods for comparators with offset cancellation or offset correction (or improvement, as is the case in physical, real-world (non-theoretical) comparators) and associated methods.

Comparators according to various embodiments have certain characteristics. They provide relatively high gain and relatively low offset, and are able to resolve relatively small differential signals, for example, 50 µV. The comparators may be used in a variety of applications where such characteristics are desirable or indicated, for example, in successive-approximation (SAR) ADCs.

The comparators correct (or minimize or cancel or compensate for) offset errors from various sources to reduce (or eliminate or improve or cancel or minimize) the effect of the offsets on the comparators' precision. The offset cancellation is performed with techniques that have relatively low sensitivity to semiconductor-fabrication-process dependency (such as increasing the size of the input pairs in the stages of the comparator), which makes comparators according to various embodiments compatible with different semiconductor fabrication processes.

Figure 1:
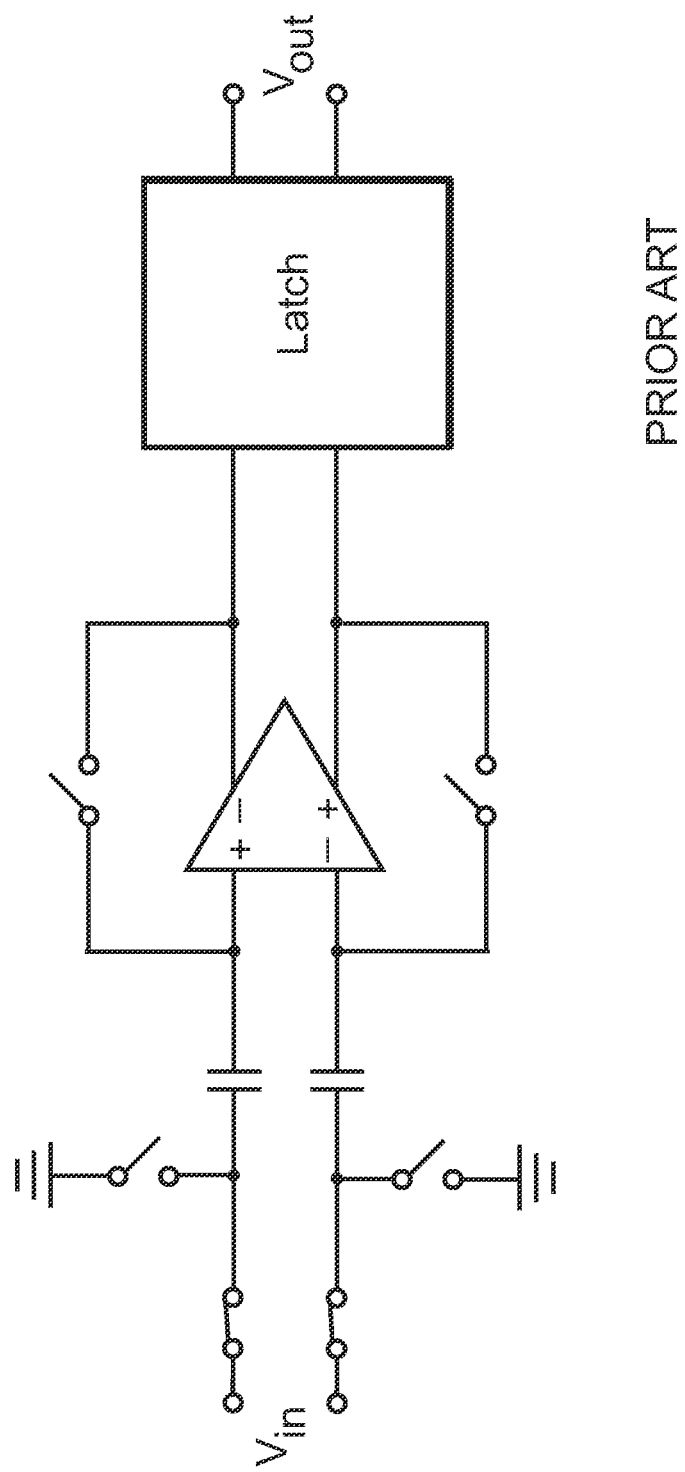
FIG. 1 shows a conventional comparator.
Figure 2:
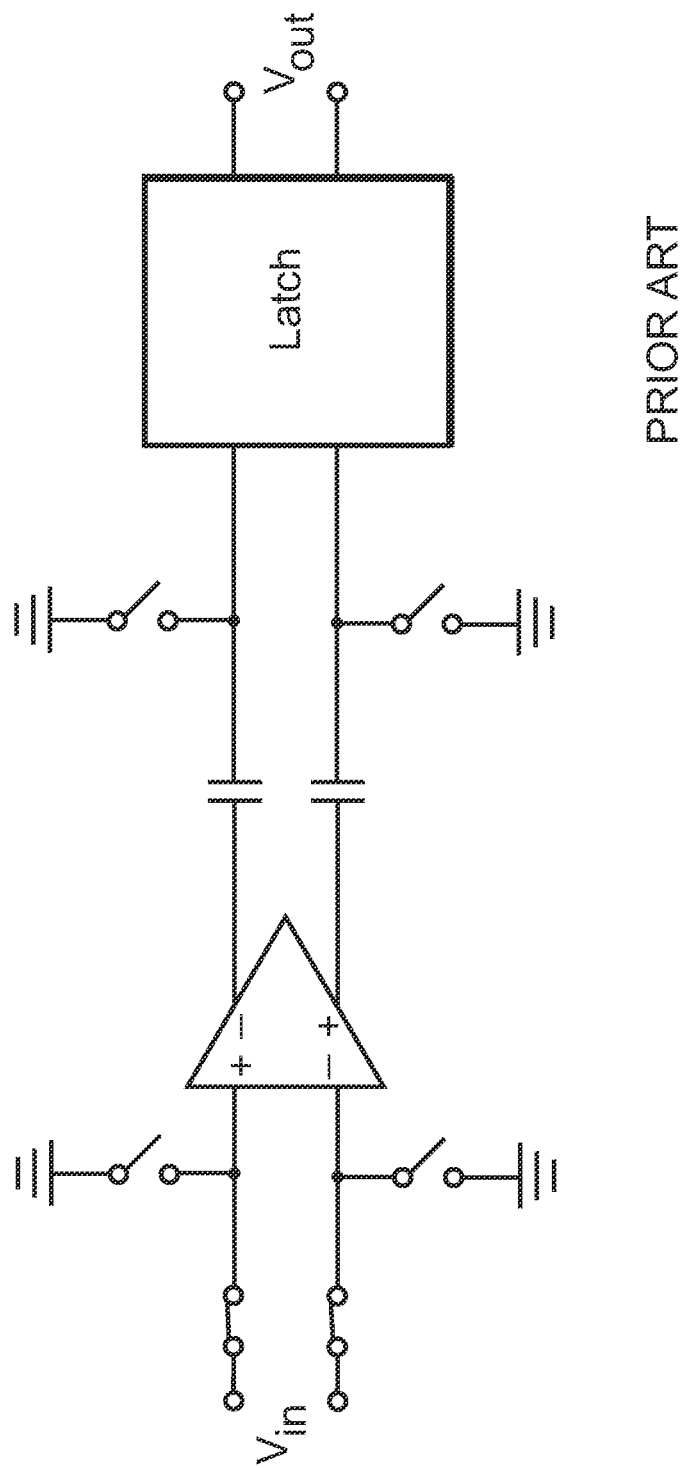
FIG. 2 shows another conventional comparator.
Figure 3:
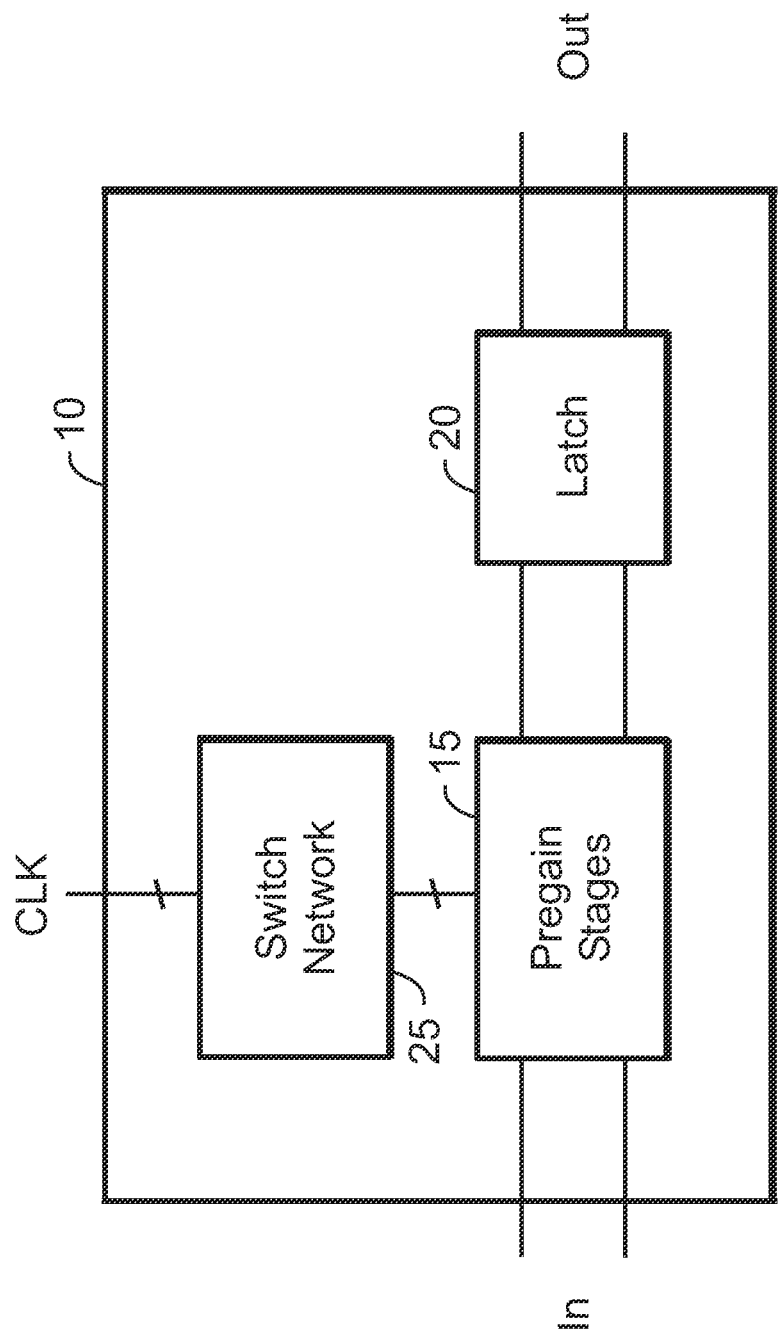
FIG. 3 shows a block diagram of a comparator according to an exemplary embodiment.

FIG. 3 shows a block diagram of a comparator 10 according to an exemplary embodiment. The comparator 10 includes one or more pregain (or gain or amplification) stages 15 coupled to receive a differential input signal of the comparator 10. The output of the pregain stages 15 drives the input of a latch 20. A pregain stage, as persons of ordinary skill in the art understand, provides some gain for the input signal of the stage and isolates it from following stages (e.g., following pregain stages) so that the input and the other comparator stages do not load each other. Pregain stages usually have relatively large bandwidths to avoid attenuating or delaying the input signal. An example of a simple pregain stage is a differential pair with a resistive load. Other implementations of pregain stages, however, are known and contemplated, as persons of ordinary skill in the art will understand.

The latch 20 is used to hold the comparator output for a certain time so other circuitry can have time to read it. The latch 20 is usually controlled by a clock, shown as "CLK." Depending on the clock level, the latch will be either holding a reading or performing another function, like resetting its internal nodes or reading and capturing the inputs to produce an output level during latching/reading mode. The latch 20 provides appropriate gain across various process, voltage, and temperature (PVT) points or conditions. The output signal of the latch 20 constitutes the differential output signal of the comparator 10. The output of the latch 20 is usually treated as a digital signal that indicates if the positive input of the comparator is higher or lower compared to the negative input.

The comparator 10 further includes a switch network 25. The switch network 25 is coupled to the pregain stages 15. The switch network 25 includes a number of switches that operate in response to a set of clock signals. The switches in the switch network 25 are used for offset cancellation in the comparator 10, as described below in detail.

Figure 4:
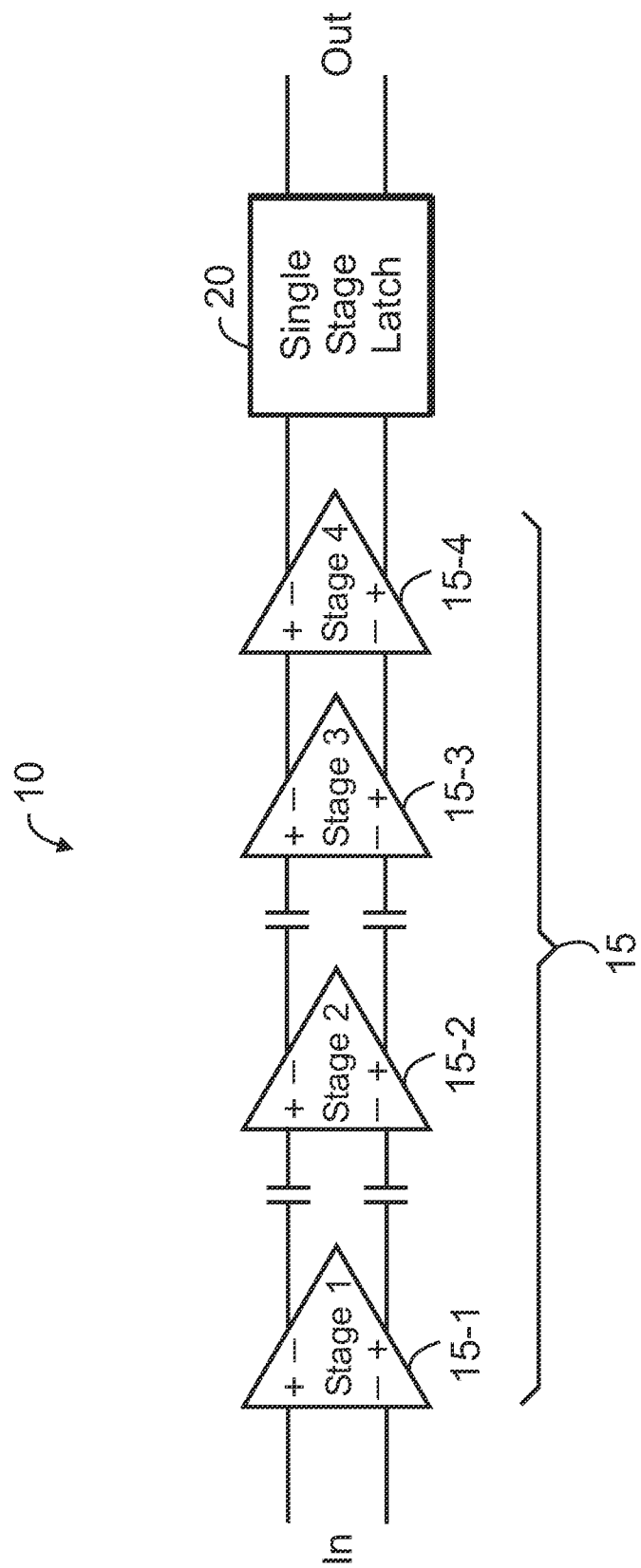
FIG. 4 shows a circuit arrangement for a comparator with multiple stages according to an exemplary embodiment.

The pregain stages 15 include a number of gain or pregain stages. FIG. 4 shows an exemplary embodiment of a comparator 10 that includes four pregain stages. The pregain stages 15 are coupled in a cascade or daisy-chain fashion via two pairs of capacitors. The capacitors are used together with the switch network (not shown to facilitate presentation) to cancel the offsets of the comparator 10. In various embodiments, such as the embodiment shown in FIG. 4, the latch 20 constitutes a single stage latch. The circuit arrangement in FIG. 4 illustrates the comparator 10 in the comparison mode, as described below in detail.

Figure 5:
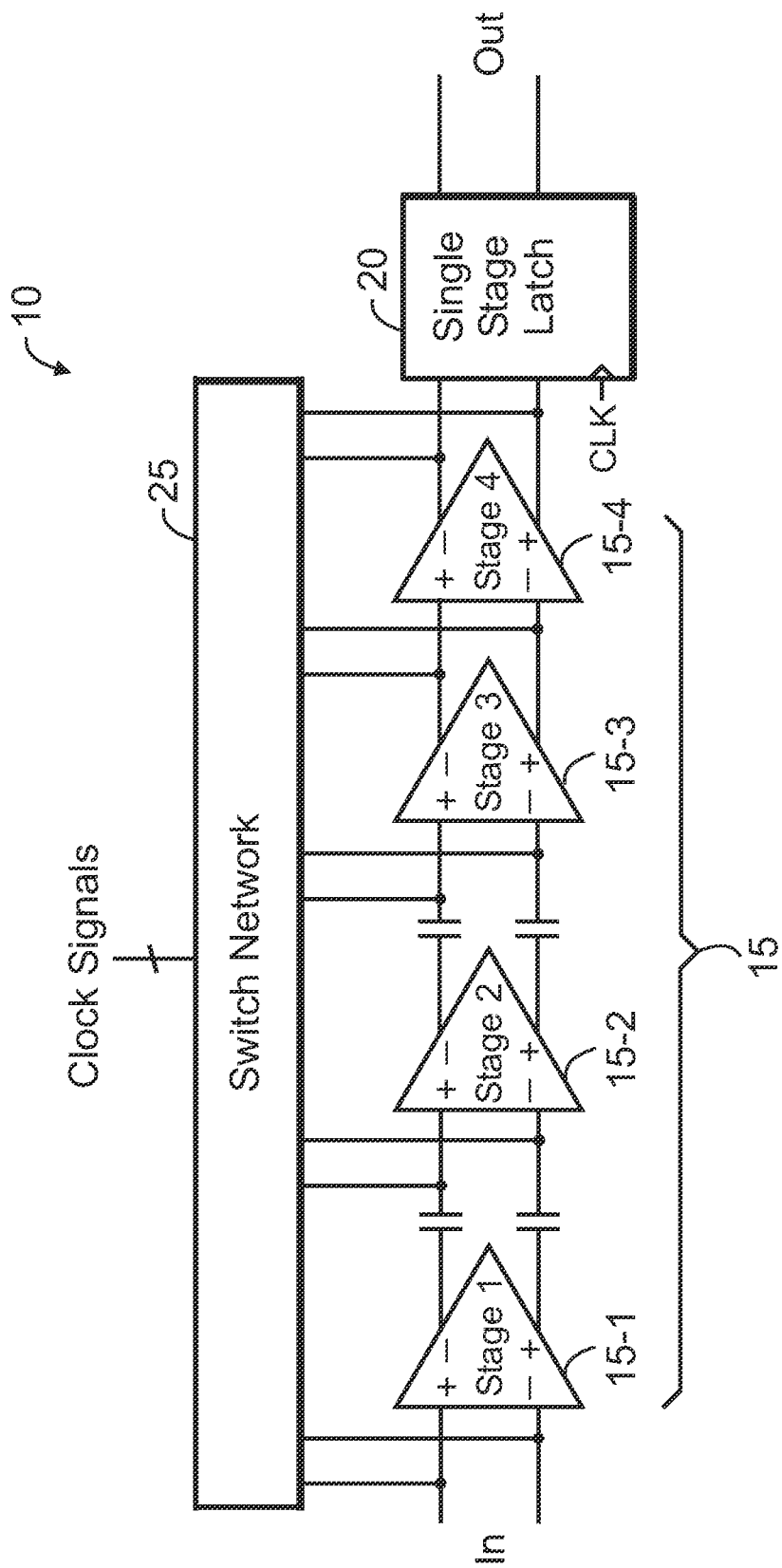
FIG. 5 shows a circuit arrangement for using a switch network for offset cancellation or correction according to an exemplary embodiment.

FIG. 5 shows the comparator 10 of FIG. 4, with the switch network 25 shown. Note that the switch network 25 is coupled to the inputs of pregain stages 1, 2, 3, and 4 (labeled, respectively, as 15-1 through 15-4), and also to the output of pregain stage 4 (i.e., the input of the latch 20).

Each of the four stages, labeled 15-1 through 15-4 (or Stage 1 through Stage 4), respectively, has an inverting input (labeled with "−") and a non-inverting input (labeled with "+") that together comprise the differential input of the respective stage. Each of the four stages has a differential output signal, with the negative signals of the output signals labeled with "−" and the positive signals of the output signals labeled with "+" (the "+" and "−" signals together provide the differential output signal of each respective stage).

Note that the output of pregain stage 1 is capacitively coupled to the input of pregain stage 2. Furthermore, note that the output of pregain stage 2 is capacitively coupled to the input of pregain stage 3. As noted above, the switch network 25 is coupled to the capacitors and various pregain stages and is used for offset cancellation in the comparator 10, as described below in detail.

Figure 6:
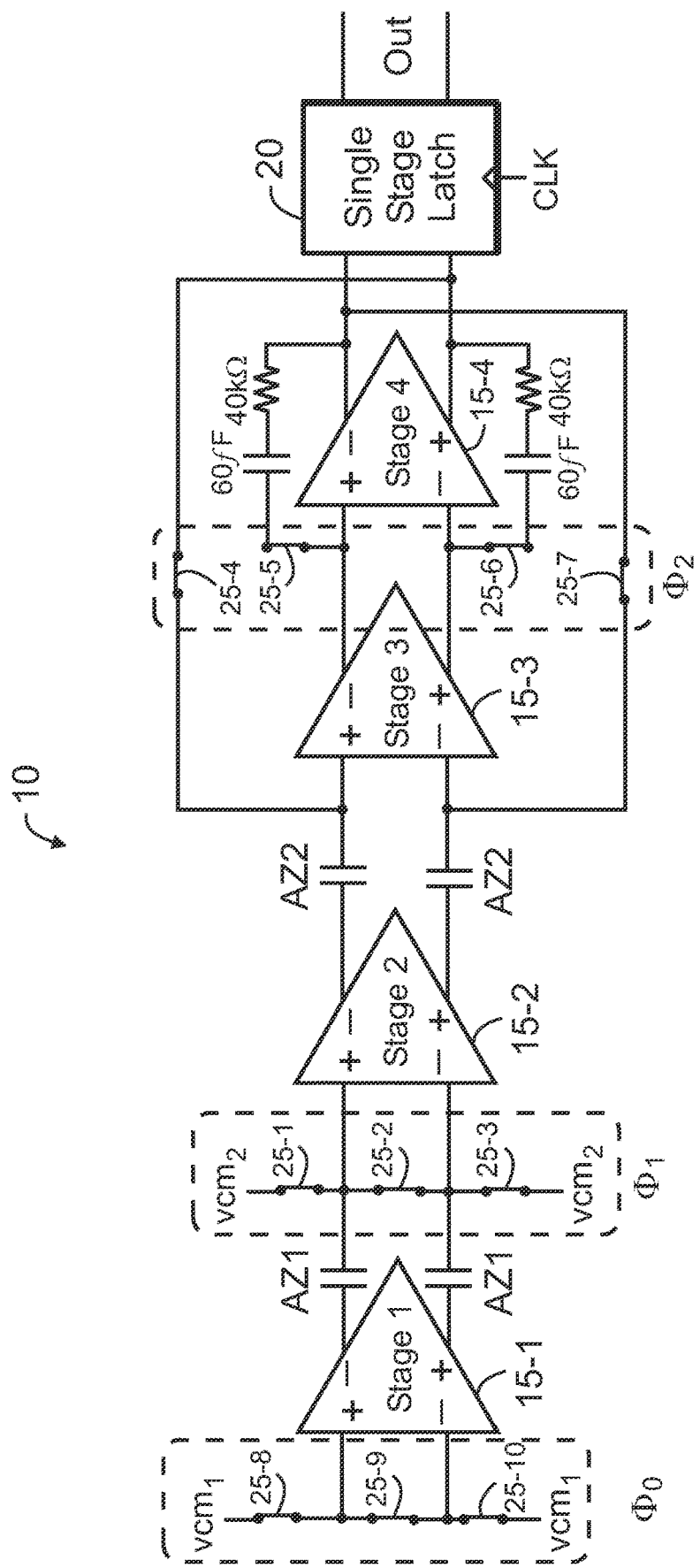
FIG. 6 shows a circuit arrangement for a comparator according to an exemplary embodiment.

FIG. 6 shows a circuit arrangement for a comparator 10 according to an exemplary embodiment. The switches in the switch network are labeled as switches 25-1 through 25-10. The switches are controlled by three clock signals, labeled Φ0, Φ1, and Φ2. In other embodiments the offset cancellation performance may be reduced in return for a reduction in the number of clock phases used. In such embodiments, clock signals Φ1 and Φ2 can be merged together, or all three clock signals can be merged together for a less accurate offset cancellation but a simpler clock control scheme.

A pair of capacitors, labeled AZ1, couples the differential output of stage 1 (labeled 15-1) to the differential input of stage 2 (labeled 15-2). Similarly, an additional pair of capacitors, labeled AZ2, couples the differential output of stage 2 (labeled 15-2) to the differential input of stage 3 (labeled 15-3). The capacitors AZ1 and the capacitors AZ2 are used to cancel the offset of all of the stages in the comparator 10, i.e., stages 15-1 through 15-4.

The switches 25-8 and 25-10 selectively couple the non-inverting input and the inverting input of the first stage (stage 15-1) to a voltage vcm1, respectively. The switches 25-8 and 25-10 are called single ended switches as they couple to one side of the differential signal (the differential input of the first pregain stage in this case). The switch 25-9 selectively couples together the non-inverting input and the inverting input of the first stage (stage 15-2). The switch 25-9 is called a differential switch as it couples to both differential nodes of the same signal (again, the differential input of the first pregain stage in this case). In a similar fashion, the switches 25-1 and 25-3 selectively couple the non-inverting input and the inverting input of the second stage (stage 15-2) to a voltage vcm2, respectively (single ended switches). The switch 25-2 selectively couples together the non-inverting input and the inverting input of the second stage (stage 15-2) (differential switch).

The switches 25-8, 25-9, and 25-10 are controlled by the clock signal Φ0. In other words, the switches 25-8, 25-9, and 25-10 are closed and opened in response to the changes in the state of the clock signal Φ0. In illustrative embodiments, when the clock signal Φ0 has a logic low value, the switches 25-8, 25-9, and 25-10 are open. Conversely, when the clock signal Φ0 has a logic high value, the switches 25-8, 25-9, and 25-10 are closed.

The switches 25-1, 25-2, and 25-3 are controlled by the clock signal Φ1. In other words, the switches 25-1, 25-2, and 25-3 are closed and opened in response to the changes in the state of the clock signal Φ1. In illustrative embodiments, when the clock signal Φ1 has a logic low value, the switches 25-1, 25-2, and 25-3 are open. Conversely, when the clock signal Φ1 has a logic high value, the switches 25-1, 25-2, and 25-3 are closed.

The switch 25-4 selectively couples the non-inverting input of the third stage (stage 15-3) to the positive output (the negative signal of the differential output signal) of the fourth stage (stage 15-4). Conversely, the switch 25-7 selectively couples the inverting input of the third stage (stage 15-3) to the negative output (the positive signal of the differential output signal) of the fourth stage (stage 15-4).

In the exemplary embodiment shown in FIG. 6, the switch 25-5 selectively couples the non-inverting input of the fourth stage (stage 15-4) to the negative output of the fourth stage via the series-coupled combination of a 60 fF capacitor and a 40 kΩ resistor. The capacitor and resistor are used as a Miller compensation capacitor and a nulling resistor, respectively, to provide stability when a feedback loop is established by closing the switch 25-4 and the switch 25-7.

Similarly, in the exemplary embodiment shown in FIG. 6, the switch 25-6 selectively couples the inverting input of the fourth stage (stage 15-4) to the positive output of the fourth stage via the series-coupled combination of a second 60 fF capacitor and a second 40 kΩ resistor. As noted above, the capacitor and resistor are used as a Miller compensation capacitor and a nulling resistor, respectively, to provide stability when a feedback loop is established by closing the switch 25-4 and the switch 25-7.

The switches 25-4, 25-5, 25-6, and 25-7 are controlled by the clock signal Φ2. In other words, the switches 25-4, 25-5, 25-6, and 25-7 are closed and opened in response to the changes in the state of the clock signal Φ2. In illustrative embodiments, when the clock signal 12 has a logic low value, the switches 25-4, 25-5, 25-6, and 25-7 are open. Conversely, when the clock signal 12 has a logic high value, the switches 25-4, 25-5, 25-6, and 25-7 are closed.

The comparator 10 has two operating modes. One mode is a comparison mode (or normal operation mode), i.e., when the comparator 10 compares the input signals applied to its input (e.g., as shown in the exemplary embodiment in FIG. 4). The other mode is a sampling (or setup or preparation) mode, during which offset sampling in order to cancel the offset takes place (e.g., as shown in the exemplary embodiment in FIG. 6).

Typically, the sampling mode is performed or used before the comparison mode. To facilitate presentation, however, the comparison mode is described first. Note that because charge leakage can discharge the offset stored on the sampling capacitors AZ1 and AZ2, the comparator cannot stay in the comparison mode for too long of a time period, and is switched back to the sampling mode to sample the offset again.

In the comparison mode of operation, the switches 25-1 through 25-10 are opened. In other words, the clock signals Φ0, Φ1, and Φ2 have states (e.g., as provided from a controller (not shown), a circuit external to the comparator 10, etc.) that cause the switches 25-1 through 25-10 to be in the open state or condition.

In this mode, the circuitry of the comparator 10 in FIG. 6 effectively behaves as does the comparator 10 in FIG. 4. Thus, the comparator 10 compares the values of the inputs signals applied to its differential input, and provides an output signal at its differential output that represents the results of the comparison.

In the other mode, i.e., the sampling mode, the clock signals Φ0, Φ1, and Φ2 are applied to the switch network 25 to cancel the offsets in the comparator 10. During this mode, fixed (or relatively or nearly fixed, in a real-world, practical implementation) DC voltages vcm1 and vcm2 are used, as shown in FIG. 6.

More specifically, the fixed DC voltages vcm1 and vcm2 are used to set the DC operating points of the various stages of the comparator 10. The differential input of the comparator 10 is coupled to the fixed DC voltage vcm1 through switches 25-8 to 25-10.

The inputs of the comparator are thus shorted together. As a result, any offset in stage 1 (15-1) will appear at the output of the first stage, i.e., will be stored on the capacitors AZ1 (more specifically, on the left plates of the capacitors AZ1). If the circuit were ideal and no offset were present in stage 1, the capacitor AZ1 would store the common mode output on its left plate, and the voltage vcm2 on the right plate. So when the comparator goes into the comparison mode, the second stage would see the voltage vcm2 as its input common mode. Since the circuit is not ideal because of the limitations of a real-life, physical implementation, and an offset will show at the output of the first stage, it will be stored together with the other signals on the capacitors AZ1.

During the sampling mode, the switches 25-1 through 25-10 are closed via the operation of the clock signals Φ0, Φ1, and Φ2, as described above. All of the switches controlled by the clock signals Φ0, Φ1, and Φ2 can be closed together. For phase Φ2, the switches 25-5 and 25-6 should be closed before the switches 25-4 and 25-7 to avoid instability. The switches 25-4 and 25-7 create a feedback loop that can be unstable but the switches 25-5 and 25-6 couple a Miller capacitor and a nulling resistor that will force the loop into a stable state. Thus, the switches 25-5 and 25-6 should close before the switches 25-4 and 25-7, and they should be opened after those switches. As a result of closing all of the switches 25-1 to 25-10, the inputs of the second stage (stage 15-2) are also shorted together. Any offset in the second stage will therefore appear at the output of the second stage, i.e., will be stored on the capacitors AZ2 (more specifically, on the left plates of the capacitors AZ2).

Through the operation of the switches 25-4 and 25-7, the outputs of the fourth stage (15-4) are coupled to the inputs of the third stage (15-3) in a common-mode feedback path. As a result, any offset of the third and fourth stages will be stored on the capacitors AZ2 (more specifically, on the right plates of the capacitors AZ2). The common-mode feedback path will also set or fix the DC operating points for the third and fourth stages.

The outputs of Stage 4 are shorted to the inputs of Stage 3 in a common mode feedback path which will allow the offset of stages 3 and 4 to be stored at the right plate of the capacitor AZ2. The resulting offset error at the output of stage 4 will roughly be equal to the offset of the third stage according to the following equation:

$$v_{os\_total} = \frac{A}{A+1} v_{os3}$$

where $V_{os\_total}$ denotes the total voffset seen at the output of the fourth stage, $V_{os3}$ represents the offset of the third pregain stage alone, and the quantity A represents the gain of both pregain stages 3 and 4.

At the conclusion of the sampling mode, i.e., when the offset cancellation has been performed, the switches 25-1 through 25-10 are opened. The comparator 10 will then be ready for operation in the comparison mode, as described above. When opening a switch, the control signal on the switches can couple to the other nodes of the switch, thereby causing a charge injection error, which can introduce some offset as well. To avoid this outcome, different clock phases are used to open the switches in a sequence that will reduce the offset due to this charge injection as much as possible. The goal is to cancel as much offset as possible, store what cannot be canceled, so that if any offset is left over, it should have minimum effect.

The sequence starts by first opening the switches (25-8 through 25-10) coupled to the inputs of the first stage. These switches are controlled by the (D0 clock signal. Any charge injection offset that results at the end of this stage will be seen at the inputs of the first stage and will get amplified and stored on the capacitors AZ1 as clock domain Φ1 is still closed, and thus it will get cancelled. To reduce the charge injection even further, a combination of single ended switches (switch 25-8 and switch 25-10) and differential switch (switch 25-9) are used instead of only using single ended switches. The single ended switches will open first, causing charge injection at the inputs of the first stage. But since the differential switch is still closed, the charge will get redistributed and cause the same voltage on both nodes of the differential switch, thus they will not produce any offset due to charge injection when they are opened. Next the differential switch 25-9 opens. The differential switch is usually a smaller switch, and so it will inject a smaller and almost equal amount of charge on both of its nodes (the inputs of the first stage). This will be the offset that will be seen at the end of Φ0, which will get stored and canceled by the capacitors AZ1.

Next a similar scenario happens with the Φ1 clock signal. Single ended switches (25-1 and 25-3) open first, and their charge injection offset will get canceled by the differential switch 25-2. Thereafter, the differential switch 25-2 opens, and any offset due to its charge injection will be seen at the input of the second stage, and will get stored and canceled by the capacitors AZ2. The last clock phase corresponds to the clock signal 12. Since any charge injected offset here will not get amplified, and since no more phases in the comparator are left, this phase's charge injected offset is not canceled and will add to the final offset error of the comparator 10. When this offset is referred back to the input, it will be divided by the gains of pregain stages 1 and 2, and will become effectively relatively small. For the clock signal 12, switches 25-4 and 25-7 open first in order to interrupt the feedback path before opening the switches 25-5 and 25-6. Doing so avoids instability if the compensation paths (the Miller capacitors and nulling resistors) are uncoupled while the feedback is still present.

Comparators according to various embodiments may be used in a variety of applications, as desired. Without limitation, some applications are described below.

Figure 7:
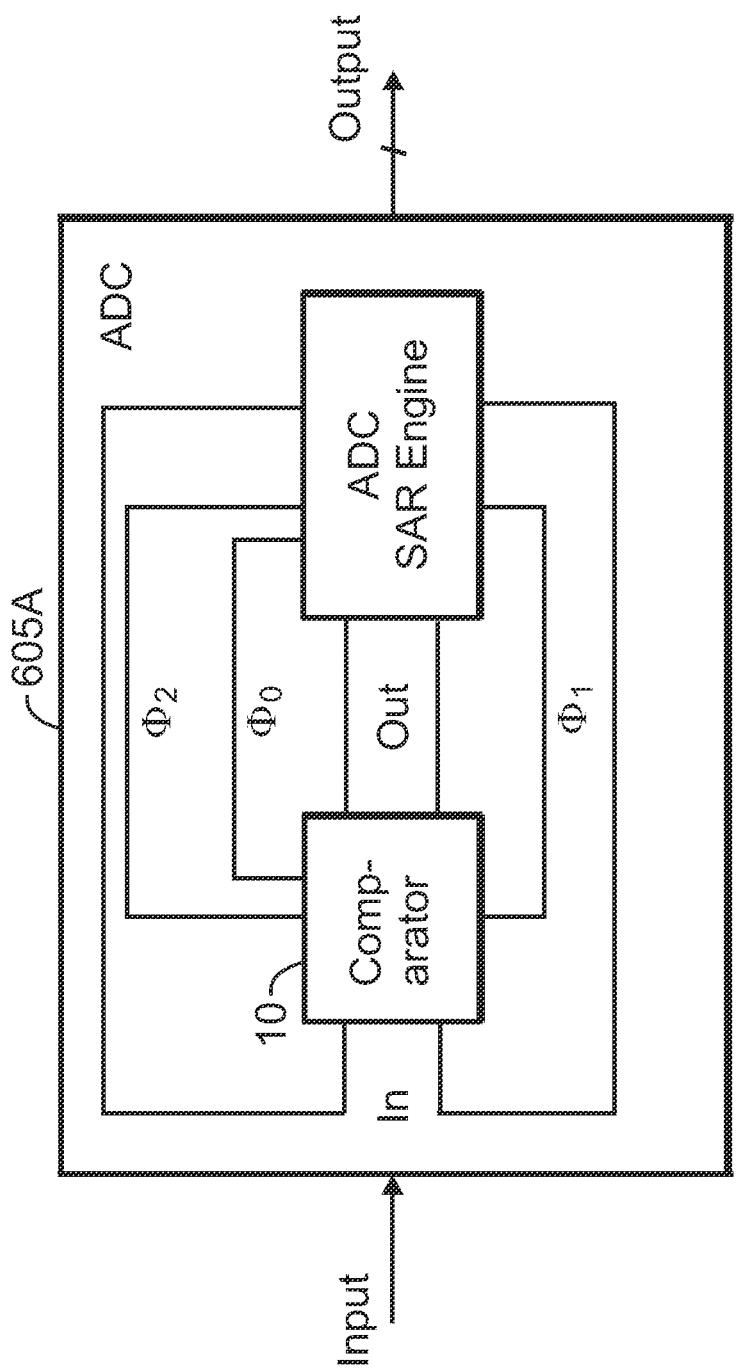
FIG. 7 shows a circuit arrangement for an analog-to-digital (ADC) including a comparator according to an exemplary embodiment.

FIG. 7 shows a circuit arrangement for an ADC 605A that includes a comparator 10 according to an exemplary embodiment. The ADC is a SAR-type ADC, and includes the ADC SAR engine, as persons of ordinary skill in the art understand.

The ADC SAR engine provides the clock signals Φ0, Φ1, and Φ2 to the comparator 10. The ADC SAR engine also provides a set of signals that drive the differential inputs of the comparator 10. The differential outputs of the comparator 10 are provided to the ADC SAR engine.

Figure 8:
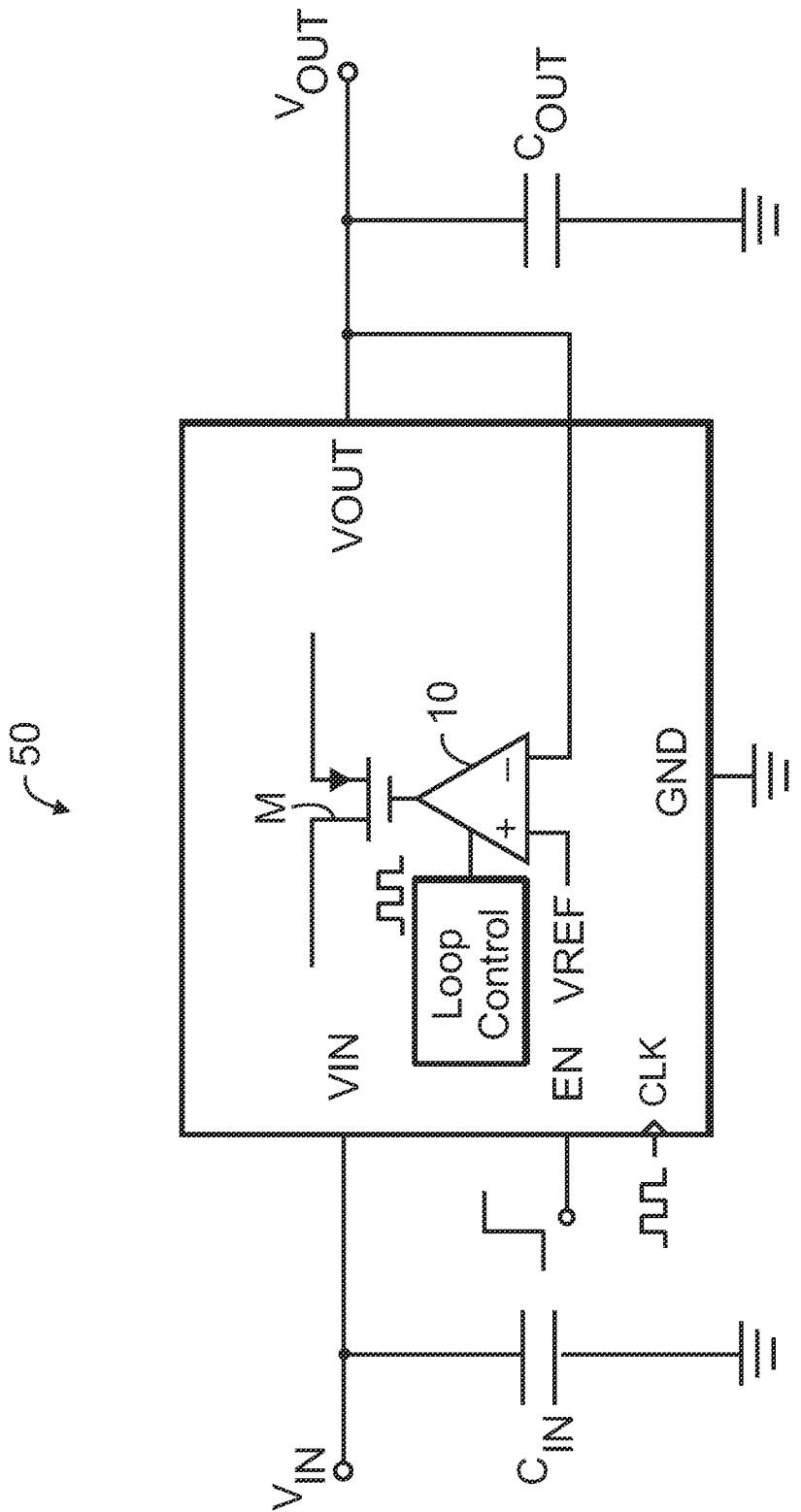
FIG. 8 shows a circuit arrangement for a switch-mode converter including a comparator according to an exemplary embodiment.

FIG. 8 shows a circuit arrangement 50 for a switch-mode regulator including the comparator 10 according to an exemplary embodiment. An input voltage $V_{IN}$, filtered by the capacitor $C_{IN}$, an enable signal EN, and clock switching signal CLK are provided to the inputs of the regulator. The output voltage $V_{OUT}$ of the regulator is filtered by the capacitor $C_{OUT}$.

A fed back sample of the output voltage of the regulator is provided to the ADJ input of the regulator. The signal received at the ADJ input is compared with a reference voltage VREF by the comparator 10. A loop control circuit provides the clock signals Φ0, Φ1, and Φ2 to the comparator 10.

The output of the comparator 10 is used to control a switch, typically a transistor M. The transistor is used to charge the output capacitor $C_{OUT}$ when the voltage across the capacitor drops in order to keep the voltage of the regulator relatively close to the reference voltage. The details of the topology and operation of the switching regulator depend on design and specification details, such as the magnitudes of the input and output voltages, etc., as persons of ordinary skill in the art will understand.

Figure 9:
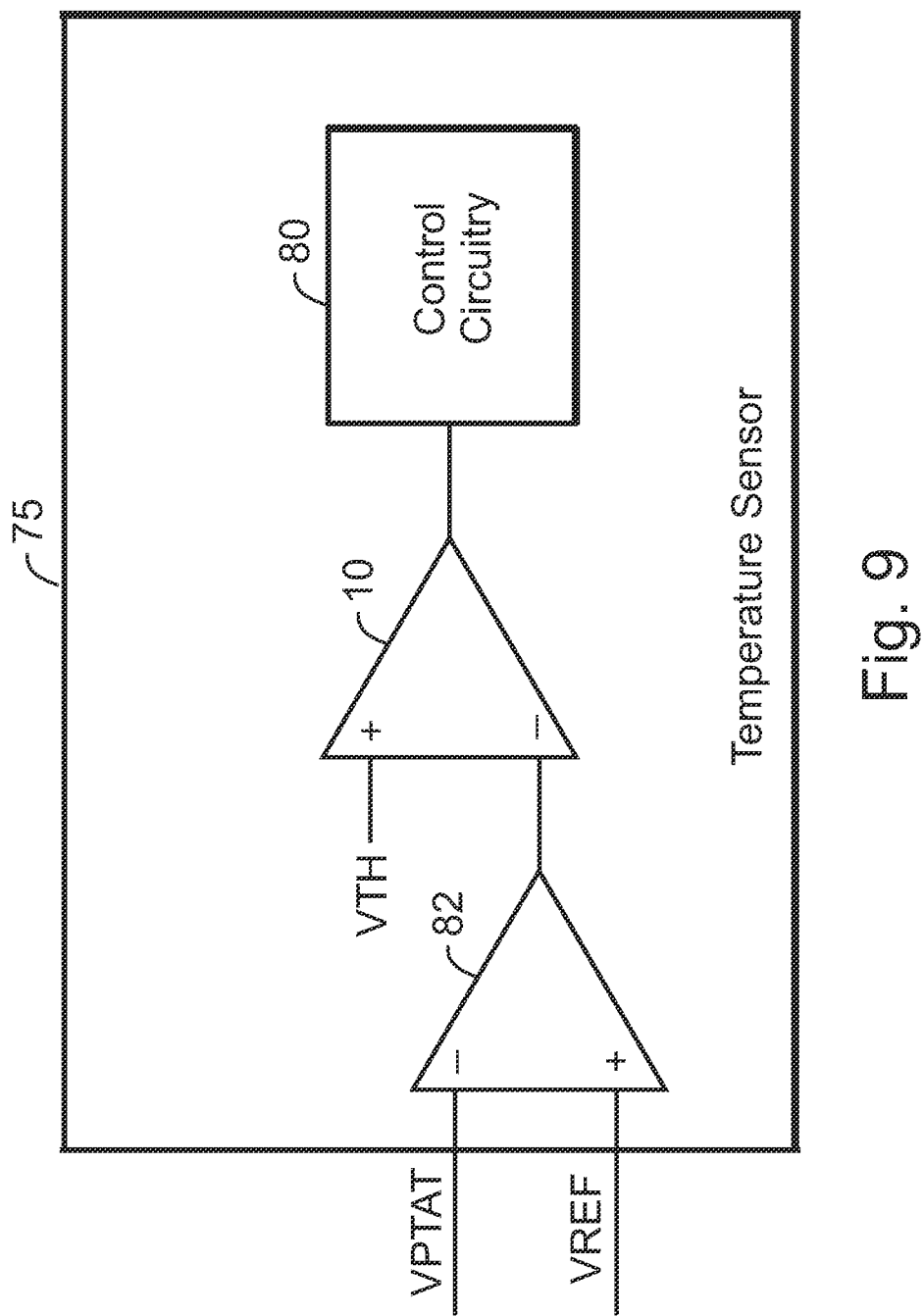
FIG. 9 shows a circuit arrangement for a temperature sensor including a comparator according to an exemplary embodiment.

FIG. 9 shows a circuit arrangement 75 for a temperature sensor including a comparator 10 according to an exemplary embodiment. The temperature sensor uses an amplifier 82 to amplify a difference between a voltage VPTAT and a reference voltage VREF. The voltage VPTAT represents a temperature-dependent voltage, i.e., proportional to absolute temperature (e.g., as generated by a sensor, etc.).

The output signal of the amplifier 82 feeds the inverting input of the comparator 10, whereas a threshold voltage VTH drives the non-inverting input of the comparator 10. The comparator 10 compares the two input signals. The results of the comparison are provided to the control circuitry 80. The control circuitry may further process the results of the comparison, control various circuitry, etc., as persons of ordinary skill in the art will understand. The low offset of the comparator 10, owing to the offset cancellation described above, will translate to lower offset error in the temperature sensor 75.

Figure 10:
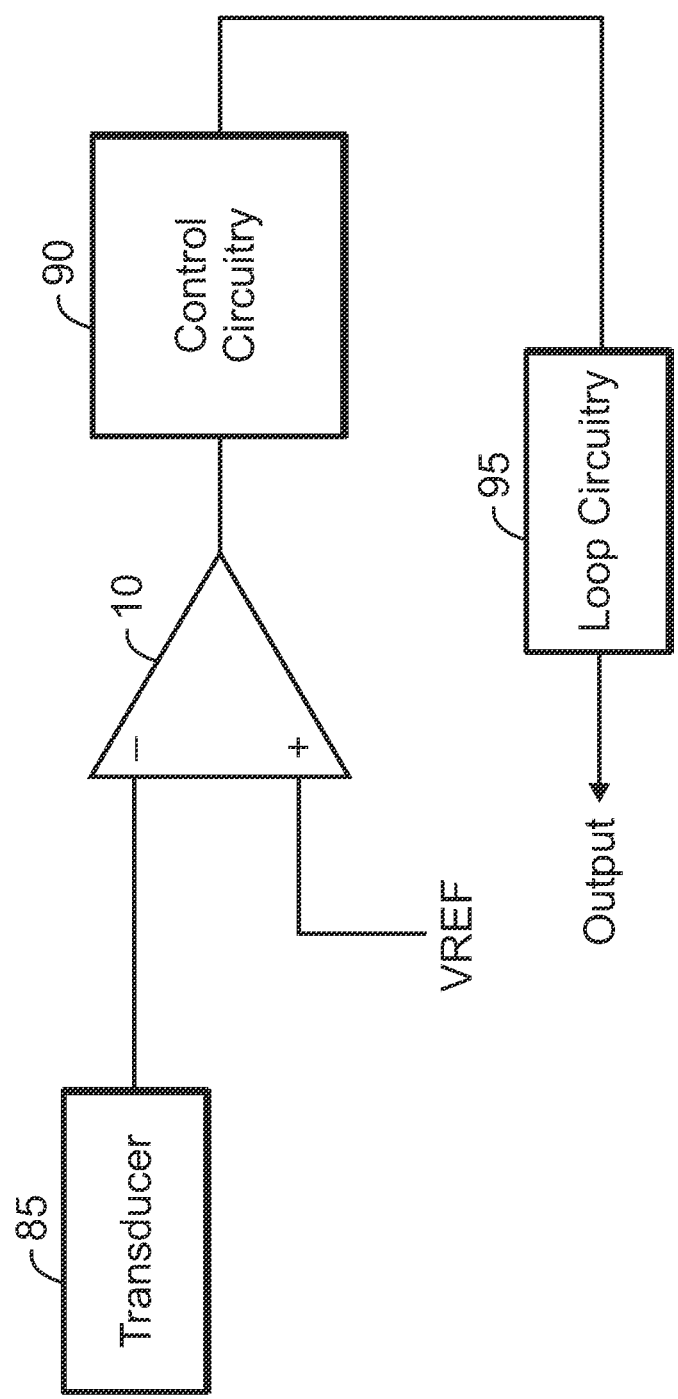
FIG. 10 shows a circuit arrangement for a control system including a comparator according to an exemplary embodiment.

FIG. 10 shows a circuit arrangement for a control system including a comparator 10 according to an exemplary embodiment. The control system includes a transducer 85 that converts a physical quantity (e.g., audio input, pressure input, vibration input, etc.) to an electrical signal.

The output of the transducer 85 is coupled to the inverting input of the comparator 10. A reference voltage VREF drives the non-inverting input of the comparator 10. The comparator 10 compares the output signal of the transducer 85 to the reference voltage.

The output voltage of the comparator 10 is provided to the control circuitry 90. The control circuitry 90 may perform various processes on the output signal of the comparator 10 based on or derived from the output signal of the comparator 10. Examples include proportional control, integral control, differential control, proportional-integral-differential control, etc., as persons of ordinary skill in the art will understand.

One or more outputs of the control circuitry 90 drive the loop circuitry 95, which generates a physical quantity in response to the signals from the control circuitry 90. Thus, a control feedback loop is established around circuitry that includes the comparator 10.

Figure 11:
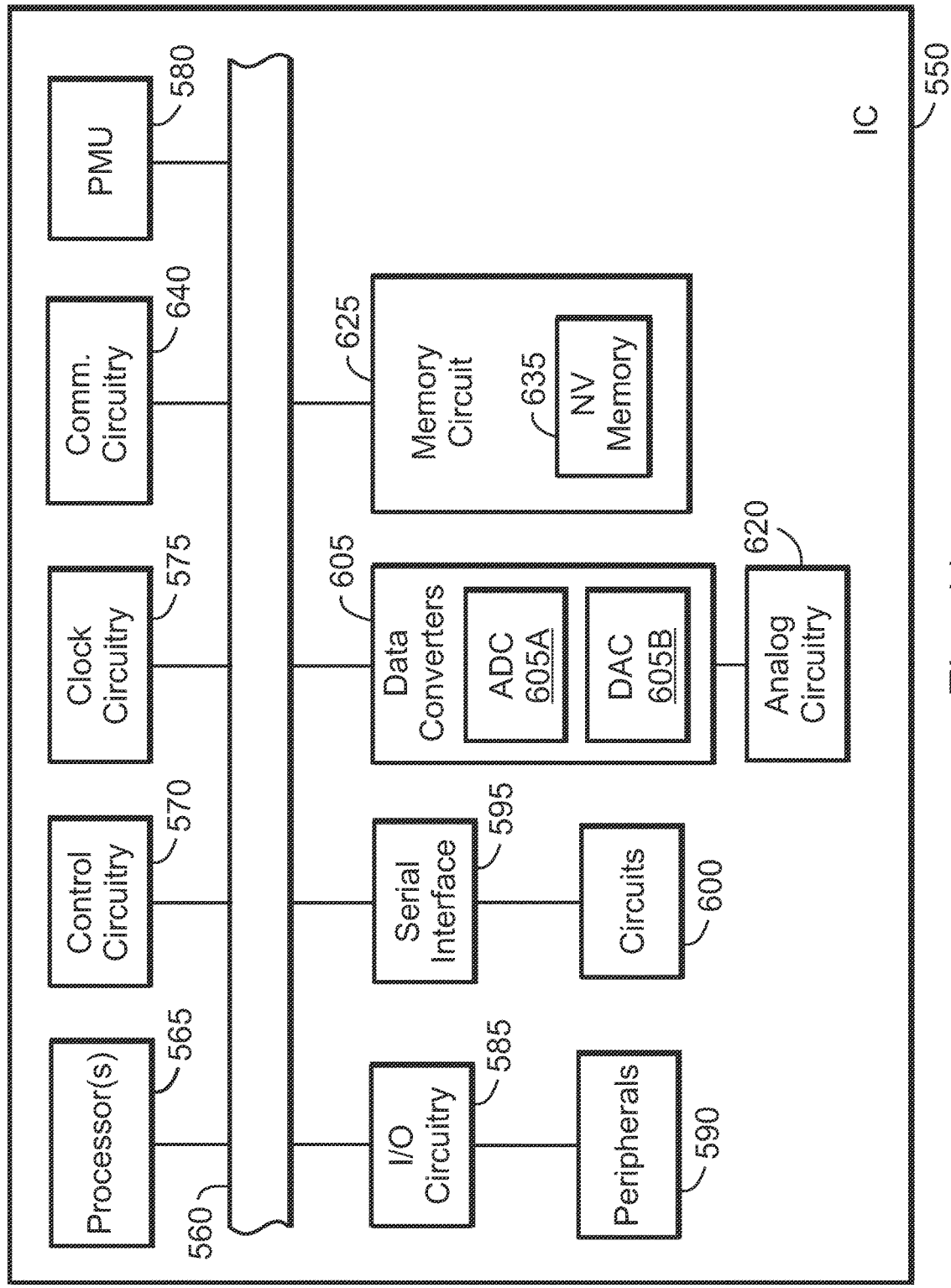
FIG. 11 shows a circuit arrangement for an IC, including circuitry that use one or more comparators, according to an exemplary embodiment.

Comparators according to various embodiments may be used in a variety of circuits, blocks, subsystems, and/or systems. For example, in some embodiments, such comparators may be integrated in an IC, such as an MCU. FIG. 11 shows a circuit arrangement for such an exemplary embodiment.

The circuit arrangement includes an IC 550, which constitutes or includes an MCU. IC 550 includes a number of blocks (e.g., processor(s) 565, data converter 605, I/O circuitry 585, etc.) that communicate with one another using a link 560. In exemplary embodiments, link 560 may constitute a coupling mechanism, such as a bus, a set of conductors or semiconductor elements (e.g., traces, devices, etc.) for communicating information, such as data, commands, status information, and the like.

IC 550 may include link 560 coupled to one or more processors 565, clock circuitry 575, and power management circuitry or power management unit (PMU) 580. In some embodiments, processor(s) 565 may include circuitry or blocks for providing information processing (or data processing or computing) functions, such as central-processing units (CPUs), arithmetic-logic units (ALUs), and the like. In some embodiments, in addition, or as an alternative, processor(s) 565 may include one or more DSPs. The DSPs may provide a variety of signal processing functions, such as arithmetic functions, filtering, delay blocks, and the like, as desired.

Clock circuitry 575 may generate one or more clock signals that facilitate or control the timing of operations of one or more blocks in IC 550. Clock circuitry 575 may also control the timing of operations that use link 560, as desired. In some embodiments, clock circuitry 575 may provide one or more clock signals via link 560 to other blocks in IC 550.

In some embodiments, PMU 580 may reduce an apparatus's (e.g., IC 550) clock speed, turn off the clock, reduce power, turn off power, disable (or power down or place in a lower power consumption or sleep or inactive or idle state), enable (or power up or place in a higher power consumption or normal or active state) or any combination of the foregoing with respect to part of a circuit or all components of a circuit, such as one or more blocks in IC 550. Further, PMU 580 may turn on a clock, increase a clock rate, turn on power, increase power, or any combination of the foregoing in response to a transition from an inactive state to an active state (including, without limitation, when processor(s) 565 make a transition from a low-power or idle or sleep state to a normal operating state).

Link 560 may couple to one or more circuits 600 through serial interface 595. Through serial interface 595, one or more circuits or blocks coupled to link 560 may communicate with circuits 600. Circuits 600 may communicate using one or more serial protocols, e.g., SMBUS, I2C, SPI, and the like, as person of ordinary skill in the art will understand.

Link 560 may couple to one or more peripherals 590 through I/O circuitry 585. Through I/O circuitry 585, one or more peripherals 590 may couple to link 560 and may therefore communicate with one or more blocks coupled to link 560, e.g., processor(s) 565, memory circuit 625, etc.

In exemplary embodiments, peripherals 590 may include a variety of circuitry, blocks, and the like. Examples include I/O devices (keypads, keyboards, speakers, display devices, storage devices, timers, sensors, etc.). Note that in some embodiments, some peripherals 590 may be external to IC 550. Examples include keypads, speakers, and the like.

In some embodiments, with respect to some peripherals, I/O circuitry 585 may be bypassed. In such embodiments, some peripherals 590 may couple to and communicate with link 560 without using I/O circuitry 585. In some embodiments, such peripherals may be external to IC 550, as described above.

Link 560 may couple to analog circuitry 620 via data converter(s) 605. Data converter(s) 605 may include one or more ADCs 605A and/or one or more DACs 605B.

ADC(s) 605A receive analog signal(s) from analog circuitry 620, and convert the analog signal(s) to a digital format, which they communicate to one or more blocks coupled to link 560. Conversely, DAC(s) 605B receive digital signal(s) from one or more blocks coupled to link 560, and convert the digital signal(s) to analog format, which they communicate to analog circuitry 620.

Analog circuitry 620 may include a wide variety of circuitry that provides and/or receives analog signals. Examples include comparators (such as the comparator 10 described above), sensors, transducers, and the like, as person of ordinary skill in the art will understand. In some embodiments, analog circuitry 620 may communicate with circuitry external to IC 550 to form more complex systems, sub-systems, control blocks or systems, feedback systems, and information processing blocks, as desired.

Control circuitry 570 couples to link 560. Thus, control circuitry 570 may communicate with and/or control the operation of various blocks coupled to link 560 by providing control information or signals. In some embodiments, control circuitry 570 also receives status information or signals from various blocks coupled to link 560. In addition, in some embodiments, control circuitry 570 facilitates (or controls or supervises) communication or cooperation between various blocks coupled to link 560.

In some embodiments, control circuitry 570 may initiate or respond to a reset operation or signal. The reset operation may cause a reset of one or more blocks coupled to link 560, of IC 550, etc., as person of ordinary skill in the art will understand. For example, control circuitry 570 may cause PMU 580 or other circuitry in IC 550 to reset to an initial or known state.

In exemplary embodiments, control circuitry 570 may include a variety of types and blocks of circuitry. In some embodiments, control circuitry 570 may include logic circuitry, finite-state machines (FSMs), or other circuitry to perform operations such as the operations described above.

Communication circuitry 640 couples to link 560 and also to circuitry or blocks (not shown) external to IC 550. Through communication circuitry 640, various blocks coupled to link 560 (or IC 550, generally) can communicate with the external circuitry or blocks (not shown) via one or more communication protocols. Examples of communications include USB, Ethernet, and the like. In exemplary embodiments, other communication protocols may be used, depending on factors such as design or performance specifications for a given application, as person of ordinary skill in the art will understand.

As noted, memory circuit 625 couples to link 560. Consequently, memory circuit 625 may communicate with one or more blocks coupled to link 560, such as processor(s) 565, control circuitry 570, I/O circuitry 585, etc.

Memory circuit 625 provides storage for various information or data in IC 550, such as operands, flags, data, instructions, and the like, as persons of ordinary skill in the art will understand. Memory circuit 625 may support various protocols, such as double data rate (DDR), DDR2, DDR3, DDR4, and the like, as desired.

In some embodiments, memory read and/or write operations by memory circuit 625 involve the use of one or more blocks in IC 550, such as processor(s) 565. A direct memory access (DMA) arrangement (not shown) allows increased performance of memory operations in some situations. More specifically, DMA (not shown) provides a mechanism for performing memory read and write operations directly between the source or destination of the data and memory circuit 625, rather than through blocks such as processor(s) 565.

Memory circuit 625 may include a variety of memory circuits or blocks. In the embodiment shown, memory circuit 625 includes non-volatile (NV) memory 635. In addition, or instead, memory circuit 625 may include volatile memory (not shown), such as random access memory (RAM). NV memory 635 may be used for storing information related to performance, control, or configuration of one or more blocks in IC 550. For example, NV memory 635 may store configuration information or firmware for various blocks or circuits in IC 550.

Comparators according to various embodiments may be used in a variety of circuits or blocks in IC 550. For example, in some embodiments, comparator(s) may be used in I/O circuitry 585 to provide an interface to peripherals 590, or in addition or as an alternative in peripherals 590.

As another example, in some embodiments, comparator(s) may be used in PMU 580, for instance, to determine whether thresholds (e.g., power voltage thresholds) have been met. As another example, in some embodiments, comparator(s) may be used in ADC 605A, as described above, or in DAC 605B, or both. Comparator(s) may be used in other blocks or additional blocks of IC 550, as desired, and such use is contemplated, as persons of ordinary skill in the art will understand.

Various circuits and blocks described above and used in exemplary embodiments may be implemented in a variety of ways and using a variety of circuit elements or blocks. For example, the latch 20, the pregain stages 15, and the switches may generally be implemented using analog and/or mixed-signal circuitry. The circuitry may include bias circuits, decoupling circuits, coupling circuits, supply circuits, current mirrors, current and/or voltage sources, filters, amplifiers, converters, signal processing circuits (e.g., multipliers), sensors or detectors, transducers, discrete components (transistors, diodes, resistors, capacitors, inductors), analog MUXs, and the like, as desired, and as persons of ordinary skill in the art will understand.

In addition, digital circuitry or mixed-signal circuitry or both may be included. The digital circuitry may include circuit elements or blocks such as gates, digital multiplexers (MUXs), latches, flip-flops, registers, finite state machines (FSMs), processors, programmable logic (e.g., field programmable gate arrays (FPGAs) or other types of programmable logic), arithmetic-logic units (ALUs), standard cells, custom cells, custom analog cells, etc., as desired, and as persons of ordinary skill in the art will understand. The mixed-signal circuitry may include analog to digital converters (ADCs), digital to analog converters (DACs), etc.) in addition to analog circuitry and digital circuitry, as described above, and as persons of ordinary skill in the art will understand. The choice of circuitry for a given implementation depends on a variety of factors, as persons of ordinary skill in the art will understand. Such factors include design specifications, performance specifications, cost, IC or device area, available technology, such as semiconductor fabrication technology), target markets, target end-users, etc.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus, comprising:
    a comparator, comprising:
        a plurality of pregain stages, wherein the plurality of pregain stages comprises first and second pregain stages, and wherein the first pregain stage is coupled to the second pregain stage via a first pair of capacitors, and wherein the plurality of pregain stages further comprises a third pregain stage, and wherein the second pregain stage is coupled to the third pregain stage via a second pair of capacitors;
        a capacitor and a resistor coupled from an output of a pregain stage in the plurality of pregain stages to an input of the pregain stage;
        a switch network coupled to the plurality of pregain stages, wherein the switch network is operated to provide a feedback path between a pair of pregain stages in the plurality of pregain stages; and
        a latch coupled to the plurality of pregain stages.

2. The apparatus according to claim 1, wherein the latch comprises a single stage latch.

3. The apparatus according to claim 1, wherein the plurality of pregain stages comprises four pregain stages.

4. The apparatus according to claim 1, wherein pregain stages in the plurality of pregain stages are coupled in cascade.

5. The apparatus according to claim 1, wherein the switch network is operated in response to a set of clock signals in order to cancel an offset of the comparator.

6. The apparatus according to claim 5, wherein a first set of switches in the switch network is operated in response to a first clock signal, and wherein a second set of switches in the switch network is operated in response to a second clock signal.

7. The apparatus according to claim 5, wherein the switch network is operated to provide a feedback path around a pregain stage in the plurality of pregain stages.

8. An integrated circuit (IC), comprising:
    a comparator, comprising:
        a plurality of pregain stages coupled in cascade, wherein the plurality of pregain stages comprises first and second pregain stages, and wherein the first pregain stage is coupled to the second pregain stage via a first pair of capacitors, and wherein the plurality of pregain stages further comprises a third pregain stage, and wherein the second pregain stage is coupled to the third pregain stage via a second pair of capacitors;
        a capacitor and a resistor coupled from an output of a pregain stage in the plurality of pregain stages to an input of the pregain stage;
        a switch network comprising a set of switches coupled to the plurality of pregain stages, wherein the set of switches are responsive to a set of clock signals to cancel an offset of the comparator, and wherein the switch network is operated to provide a feedback path between a pair of pregain stages in the plurality of pregain stages; and
        a latch coupled to a last pregain stage in the plurality of pregain stages.

9. The apparatus according to claim 8, wherein the plurality of pregain stages comprises four pregain stages.

10. The apparatus according to claim 8, wherein the set of switches are operated in order to store the offset of the comparator on the first and second pairs of capacitors.

11. The apparatus according to claim 8, wherein the latch comprises a single stage latch.

12. The apparatus according to claim 8, wherein a first set of switches in the switch network is operated in response to a first clock signal in the set of clock signals.

13. The apparatus according to claim 12, wherein a second set of switches in the switch network is operated in response to a second clock signal in the set of clock signals.

14. A method of operating a comparator to cancel an offset of the comparator, the method comprising operating a switch network to selectively couple a pregain stage in a plurality of pregain stages to a voltage, and to selectively provide a feedback path around a pair of pregain stages in the plurality of pregain stages, wherein a first pregain stage and a second pregain stage in the plurality of pregain stages are coupled capacitively, wherein the second and a third pregain stage in the plurality of pregain stages are coupled capacitively, and wherein a capacitor and a resistor couple an output of a pregain stage in the plurality of pregain stages to an input of the pregain stage.

15. The method according to claim 14, wherein the plurality of pregain stages comprises four pregain stages.

16. The method according to claim 15, wherein operating a switch network to selectively provide the feedback path around the pair of pregain stages in the plurality of pregain stages comprises providing the feedback path around a third and a fourth pregain stage in the plurality of the pregain stages.

17. The method according to claim 14, wherein operating the switch network to selectively couple the pregain stage in the plurality of pregain stages to the voltage comprises selectively coupling inputs of the pregain stage to a fixed direct current (DC) voltage.

18. The method according to claim 14, wherein operating the switch network comprises opening and closing a set of switches in the switch network in response to a set of clock signals.

19. The method according to claim 14, further comprising latching an output of a last pregain stage in the plurality of pregain stages.

20. The method according to claim 18, wherein opening and closing a set of switches in the switch network in response to a set of clock signals comprises operating a first set of switches in the switch network in response to a first clock signal in the set of clock signals, and operating a second set of switches in the switch network in response to a second clock signal in the set of clock signals.

\* \* \* \* \*